(12) United States Patent
Masleid

(10) Patent No.: US 7,256,634 B2
(45) Date of Patent: Aug. 14, 2007

(54) ELASTIC PIPELINE LATCH WITH A SAFE MODE

(75) Inventor: Robert Paul Masleid, Monte Sereno, CA (US)

(73) Assignee: Transmeta Corporation, Santa Clara, CA (US)

( * ) Notice: Subject to any disclaimer, the term of this patent is extended or adjusted under 35 U.S.C. 154(b) by 94 days.

(21) Appl. No.: 11/176,918

(22) Filed: Jul. 6, 2005

(65) Prior Publication Data

US 2007/0008021 A1 Jan. 11, 2007

(51) Int. Cl.
*H03K 3/286* (2006.01)
*H03K 3/356* (2006.01)

(52) U.S. Cl. .................... 327/218; 326/95; 327/208; 327/212

(58) Field of Classification Search ............... None
See application file for complete search history.

(56) References Cited

U.S. PATENT DOCUMENTS

| | | | |
|---|---|---|---|
| 5,610,548 A | 3/1997 | Masleid | 327/374 |
| 6,025,738 A | 2/2000 | Masleid | 326/83 |
| 6,133,759 A | 10/2000 | Beck et al. | 326/98 |
| 6,188,259 B1 | 2/2001 | Amir et al. | |
| 6,466,063 B2 * | 10/2002 | Chen | 327/112 |
| 6,577,176 B1 | 6/2003 | Masleid et al. | 327/199 |
| 6,630,851 B2 | 10/2003 | Masleid | |
| 6,731,140 B2 | 5/2004 | Masleid et al. | 327/99 |
| 6,956,405 B2 * | 10/2005 | Lundberg | 326/95 |
| 7,076,682 B2 * | 7/2006 | Jacobson | 713/600 |
| 7,119,580 B2 * | 10/2006 | Masleid et al. | 326/86 |
| 2002/0039347 A1 * | 4/2002 | Matsugatani et al. | 370/203 |

FOREIGN PATENT DOCUMENTS

JP 13188638 7/2001

* cited by examiner

*Primary Examiner*—Tuan T. Lam

(57) ABSTRACT

An elastic pipelined latch. The latch includes a control input for configuring the latch into a repeater state or a latch state, a drive component responsive to the control input and for driving an input signal through as an output signal, and a pulse width/inhibit component coupled to the drive component. The latch further includes a reset threshold component coupled to the drive component for inhibiting oscillation of the drive component, and a latch component for passing the present state of the input signal to the output signal when configured as the repeater state and for maintaining the previous state of the output signal during transitions of a clock signal when configured as the latch state.

18 Claims, 10 Drawing Sheets

ELASTIC PIPELINE LATCH WITH A SAFE MODE

CROSS-REFERENCE TO RELATED APPLICATION

This application is related to commonly assigned U.S. patent application Ser. No. 11/096,354 entitled "A METHOD AND SYSTEM FOR ELASTIC SIGNAL PIPE-LINING" by Rozas et al., which is incorporated herein in its entirety.

TECHNICAL FIELD

The present invention relates to signal propagation for digital integrated circuit devices.

BACKGROUND ART

The design and fabrication of high-performance signaling mechanisms for digital integrated circuit devices has become a significant challenge. For example, with respect to high-performance digital integrated circuit devices operating at high frequencies, ensuring the reliable transmission of signals between the various components of such devices has become problematic. In the past, slower clock speeds allowed sufficient margins in the timing constraints for signal propagation delay. However, modern integrated circuit designs require exacting control of critical timing specifications, and design parameters must be strictly maintained to keep the entire system in balance. Additionally, the system should run efficiently across different clock frequencies. Optimizations to ensure stable high-frequency operation should not unduly penalize the system during low-frequency operation. Thus what is required is a solution that can ensure critical timing specifications remain within certain specified parameters across a range of different operating frequencies.

DISCLOSURE OF THE INVENTION

Embodiments of the present invention provide a latch for an elastic pipeline.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Figure 1:
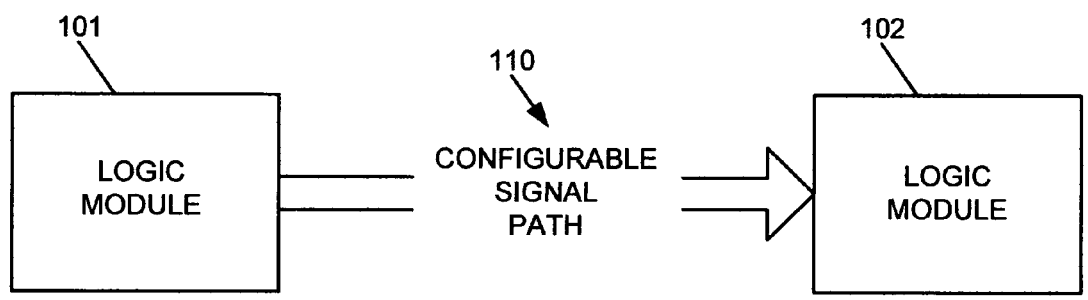
FIG. 1 shows a diagram of an elastic pipeline system in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments of the present invention implement a method and system for configuring one or more signal paths within a digital integrated circuit. The digital integrated circuit includes a plurality of functional modules linked together via configurable signal paths. Signals from one logic module to another are transmitted via a configurable signal path. The configurable signal path is variable by selectively including one or more programmable latch/repeaters on the signal path. The programmable latch/repeaters effectively pipeline the signal path to enable a higher operating frequency. The programmable latch/repeaters are scannable, and are implemented with a safe mode to enhance overall reliability.

In one embodiment, the present invention is implemented as flexible scannable latch for use in an elastic pipeline for implementing a configurable number of repeaters depending upon the application/frequency of use of the pipeline. The latch includes a control input for configuring the latch into a repeater state or a latch state, a drive component responsive to the control input and for driving an input signal through as an output signal, and a pulse width/inhibit component coupled to the drive component. The latch further includes a reset threshold component coupled to the drive component for inhibiting oscillation of the drive component, and a latch component for maintaining state of the output signal when configured as the repeater state and for maintaining state of the output signal during transitions of a clock signal when configured as the latch state.

The elasticity attribute is provided to enable the provision of either high operating frequency or low latency. The higher the operating frequency, the more programmable latch/repeaters are selectively included. As the operating frequency decreases, programmable latch/repeaters are selectively removed from signal path. In this manner, the flexible scannable latch of the present invention implements an elastic signal pipeline that can most efficiently match a signal propagation delay to an operating frequency of the digital integrated circuit. Embodiments of the present invention and their benefits are further described below.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "accessing" or "recognizing" or "retrieving" or "translating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Present Invention

FIG. 1 shows a diagram of an elastic pipeline system 100 in accordance with one embodiment of the present invention. As depicted in FIG. 1, system 100 includes a first logic module 101 and a second logic module 102. A configurable signal path 110 is shown coupling the logic module 101 and 102.

In the FIG. 1 embodiment, signals from the logic module 101 to transmitted to the logic module 102 via the configurable signal path 110. The configurable signal path 110 is variable by selectively including one or more programmable latch/repeaters.

It should be noted that as used herein, the term programmable latch/repeater can refer to programmable latch devices, programmable repeater devices, semi-transparent latch devices, edge triggered flop devices, and similar types of storage elements. The particular detailed configuration of a programmable latch/repeater can vary depending upon the specifics of an implementation.

Referring still to FIG. 1, the programmable latch/repeaters effectively pipeline the signal path 110 to enable a higher operating frequency. For example, at high clock frequencies, the actual physical distance between the logic module 101 and the logic module 102 (e.g., the distance across the integrated circuit die) may be too long to enable reliable propagation of a signal between them in one cycle. Embodiments of the present invention overcome the problem by selectively including/excluding programmable latch/repeaters on the configurable signal path 110 to ensure a reliable propagation of the signals.

Figure 2:
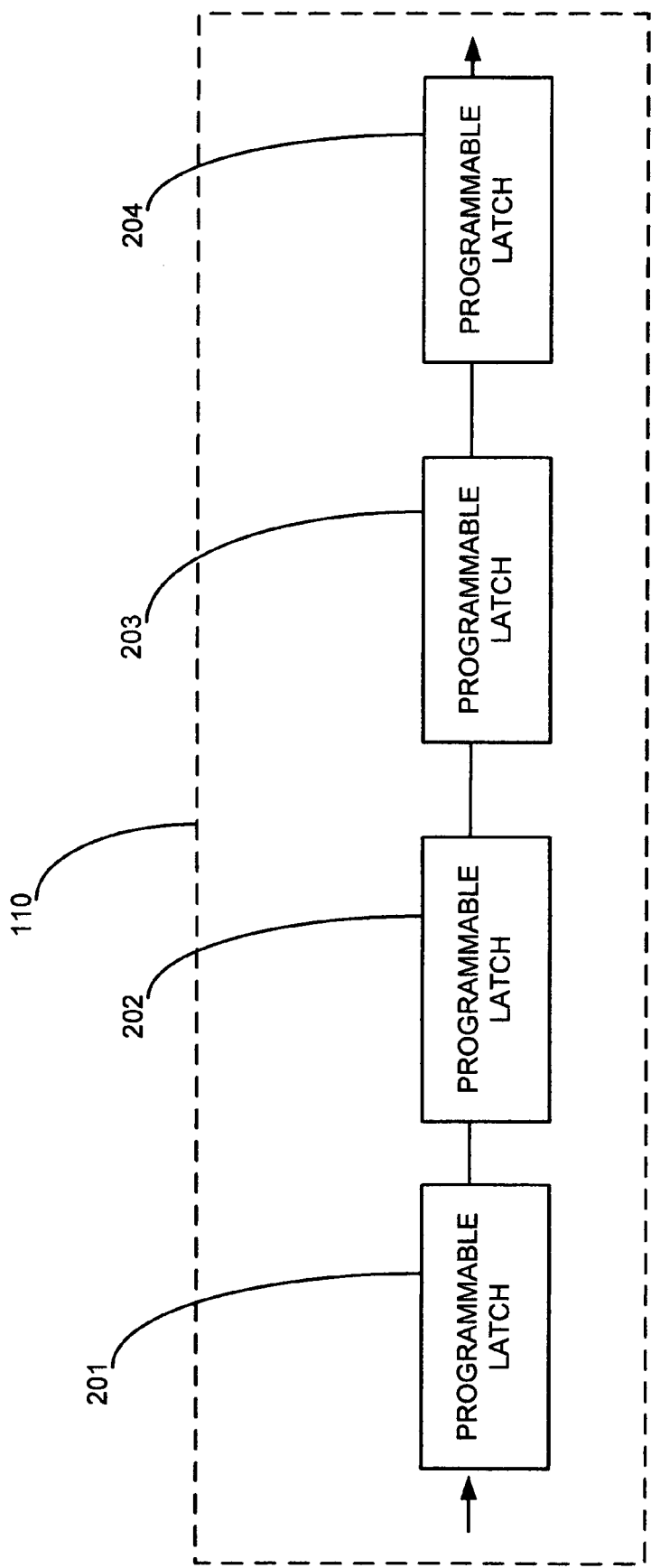
FIG. 2 shows a diagram of the configurable signal path in accordance with one embodiment of the present invention.

FIG. 2 shows a diagram of the configurable signal path 10 in accordance with one embodiment of the present invention. As depicted in FIG. 2, the configurable signal path 110 includes a plurality of programmable latch/repeaters 201–204.

As described above, as the operating frequency of system 100 increases, more of the programmable latch/repeaters 201–204 are selectively included on the signal path 110. As the operating frequency decreases, one or more of the programmable latch/repeaters 201–204 are selectively removed from signal path 110. In this manner, the configurable signal path of the present invention can optimize the number of programmable latch/repeaters included on the signal path 110 to most efficiently match a signal propagation delay related to an operating frequency of the digital integrated circuit.

In this manner, embodiments of the present invention are able to best optimize signal transmission paths between logic modules. For example, for given integrated circuit design, as transistor geometries decrease with successive process generations, and as transistors speed up by a substantial amount (e.g., in the order of 25–30% per generation), the wires that connect transistors can be configured for greater speed or lesser speed.

For example, as the process geometries of a given design shrink, the wire cross-section decreases thereby increasing resistance, while the length decreases, decreasing resistance and capacitance. Thus the wires speed up somewhat, but not as much as the transistors. This means that micro-architectures progressively have their timing dominated not by the logic depth of their combinational circuits, but rather by the transit time in the wires, especially those between functional blocks.

The prior art solution to this problem is to simply add extra registers or latches along the path, especially for the long distance wires of a design. This allows cycle time to decrease at the rate that the transistor speed would allow, but has a downside, which is that per-clock performance suffers, as operations that involve data transit increase the number of clocks that they take. For a chip that is only going to run at maximum speed (e.g., a high-performance memory, high-performance processor, etc.), this may be an acceptable trade-off. But many other chips need to retain a large dynamic range of operation. Such chips need to run at very high frequencies in some systems and under some conditions, and run at lower frequencies in other systems and under other conditions (e.g., to reduce heat generation, battery drain, etc.).

Thus the prior art solution forces a difficult choice: Should the number of registers be optimized for speed, thereby sacrificing per-clock performance in the situations where the system will operate at a lower frequency? Or should frequency be sacrificed in the interest of per-clock performance, which matters especially at lower frequencies?

Embodiments of the present invention accommodate both situations by implementing configurable signal paths, or "elastic pipelines," that allow system designers to design a chip for very high frequency, while per-clock performance is not sacrificed when running at lower frequencies.

Figure 3:
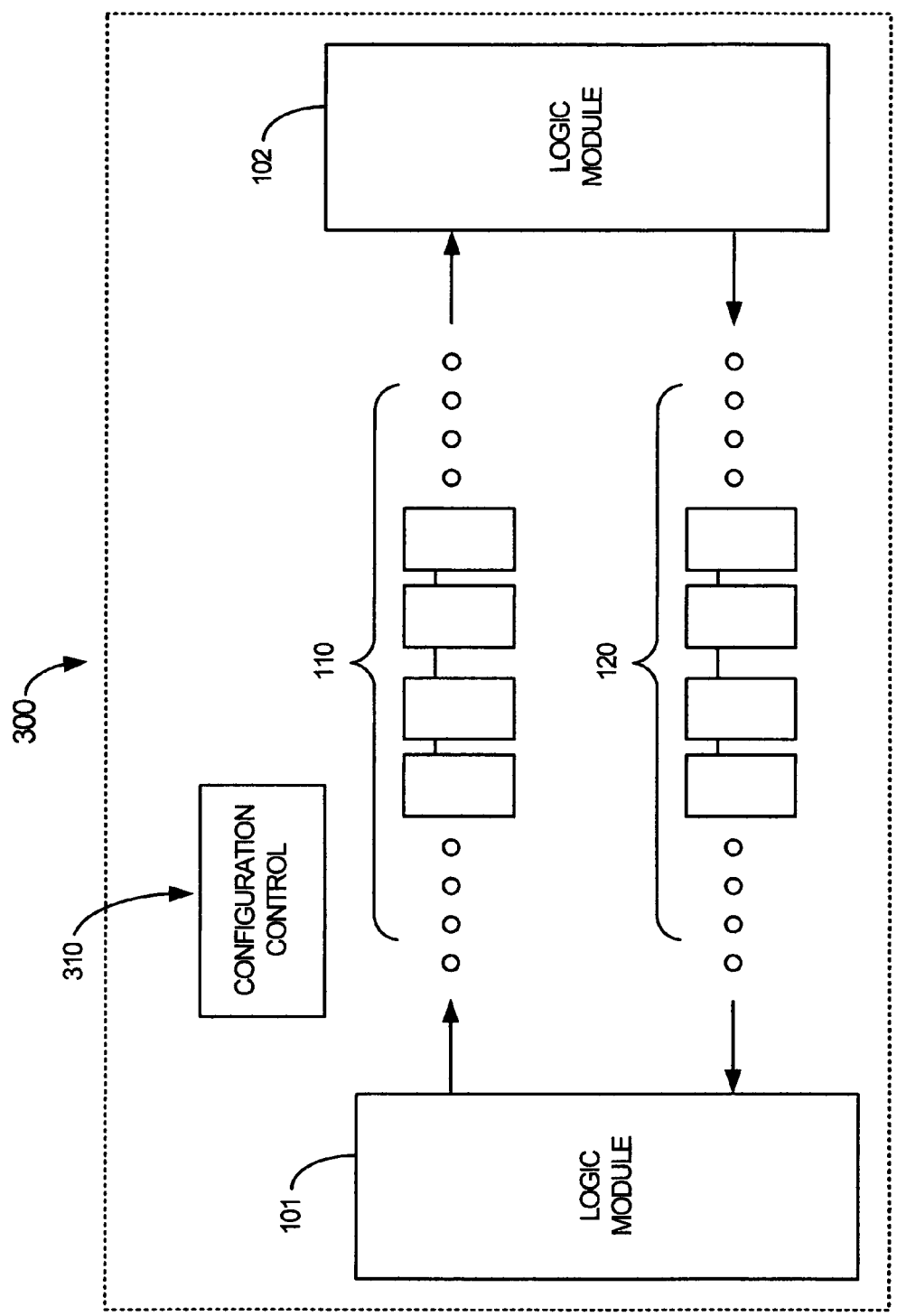
FIG. 3 shows a diagram of a system employing configurable signal paths in accordance with one embodiment of the present invention.

FIG. 3 shows a diagram of a system 300 employing configurable signal paths (e.g., configurable signal paths 110 and 120) in accordance with one embodiment of the present invention. The configurable signal paths 110 and 120 effectively decouple the logic modules (e.g., logic blocks) 101 and 102, and implement variable cycle transit signal paths between them. As known by those skilled in the art, the logic modules 101 and 102 are decoupled, meaning that a set of defined protocols govern communication between blocks/units so that either side can take longer or shorter to accomplish its task, with the other side still operating properly. For example, rather than expect a reply/response/result in exactly 3 cycles, the protocol between the two modules 101 and 102 is such that the requesting module receives the reply/response/result an arbitrary number of cycles later and is told by the other module when the result is arriving.

An example of such a protocol is the HyperTransport protocol. It is essentially a de-coupling protocol between two chips. The two chips use the protocol for inter-chip communication. HyperTransport happens to be external to a chip, but similar protocols can be used internally.

In one embodiment, when the modules 101 and 102 communicate over the configurable signal paths 110 and 120 in a decoupled protocol, each module has an internal register (or latch) to interface to the path. The originating module has a register within it from which the outgoing information starts its travel towards the other module. Similarly, the receiving module has a register within it to receive the incoming information. This allows timing analysis to proceed locally within each of these modules, as the data is delivered locally (to the outgoing register or latch) and received locally (from the incoming register or latch).

In the present embodiment, to handle inter-module distance, additional registers/latches (e.g., programmable latch/repeaters) are placed at periodic distances along the signal paths 110 and 120. Since the protocol between the modules is decoupled, the system 300 will function properly whatever the number of intermediate programmable latch/repeaters ends up being linked into the path. Thus the placement and number of programmable latch/repeaters can conceptually wait until the last moment, when the timing of the slowest internal path is known. At that point the maximum distance between programmable latch/repeaters is known, and that determines how many are needed on a long path.

In one embodiment, the late choice allows a given design to not be penalized by over-pipelining of the protocol, at the expense of having to do placement of the programmable latch/repeaters at the last minute, which may be difficult. The configurable signal paths allow the distance to be decided a-priori, given the cycle time goal for the design, while ensuring the design is not inflexibly "stuck" with that number, even if timing within some module ended up forcing the design to run slower than the goal and higher per-clock performance could have been achieved by using fewer programmable latch/repeaters.

In one embodiment, to achieve an optimal flexibility, a large number of programmable latch/repeaters are coupled along the path, wherein the number of programmable latch/repeaters is higher than the number required to meet the cycle time goals (e.g. every ⅓ cycle instead of every cycle). Each of the programmable latch/repeaters logically comprise a storage element and a buffer, where the storage element is used to optionally stage the signal by one cycle under external binary control. When the storage element is disabled, the programmable latch/repeater acts like a traditional buffer/repeater. When the storage element is enabled, the programmable latch/repeater acts like a latch or flip flop storage element followed by a buffer/repeater. In the system 300 embodiment, the external binary control is provided by the configuration control module 310. The chip is then designed according to this methodology. Then, depending on the target frequency as defined by either the achieved local timing of the communicating modules, or the system/platform constraints of operation, a sufficient set of programmable latch/repeaters are enabled to guarantee communication timing, but the rest are disabled and used as pass-through buffers.

The external control provided by the control module 310 can be implemented using a number of different means. In one embodiment, the control module 310 is software programmable to enable the variable number of programmable latch/repeaters. For example, in one embodiment, the chip resets with all the storage elements in the programmable latch/repeaters enabled, and then the control module 310 turns some of the programmable latch/repeaters off. Software control has the advantage that the chip can change its per-clock performance dynamically as operating conditions vary. For example, mobile chips often run at different frequencies in order to save power by using voltage/frequency scaling. This choice can be made by software as the chip operates.

Dynamic control can also be used to accommodate performance differences due to temperature variations. Because lower temperatures mean lower resistance, wires speed up substantially at lower temperatures. Having dynamic control of the number of programmable latch/repeaters thus allows a software algorithm to increase per-clock performance at lower temperatures, but still meet frequency goals at higher temperatures. Thus a chip so designed that is placed in a very good thermal environment would perform better than if it was placed in a worse thermal environment but was still capable of running at the same frequency.

In one embodiment, software control is eliminated and the configuration control module 310 is omitted. In such embodiment, late metal-level changes to the chip are built-in according to achieved frequency, thereby enabling or disabling the programmable latch/repeaters individually. In one embodiment, on die fuses can be used to enable or disable the programmable latch/repeaters individually. In another embodiment, external pins communicating which programmable latch/repeaters should be enabled or disabled can be used. In each case, at the higher frequencies, more programmable latch/repeaters would be required, but at the lower frequencies fewer would be required.

Additional descriptions of an elastic pipeline can be found in commonly assigned U.S. patent application Ser. No. 11/096,354, entitled "A METHOD AND SYSTEM FOR ELASTIC SIGNAL PIPELINING" by Rozas et al., filed on Mar. 31, 2005, which is incorporated herein in its entirety.

Figure 4:
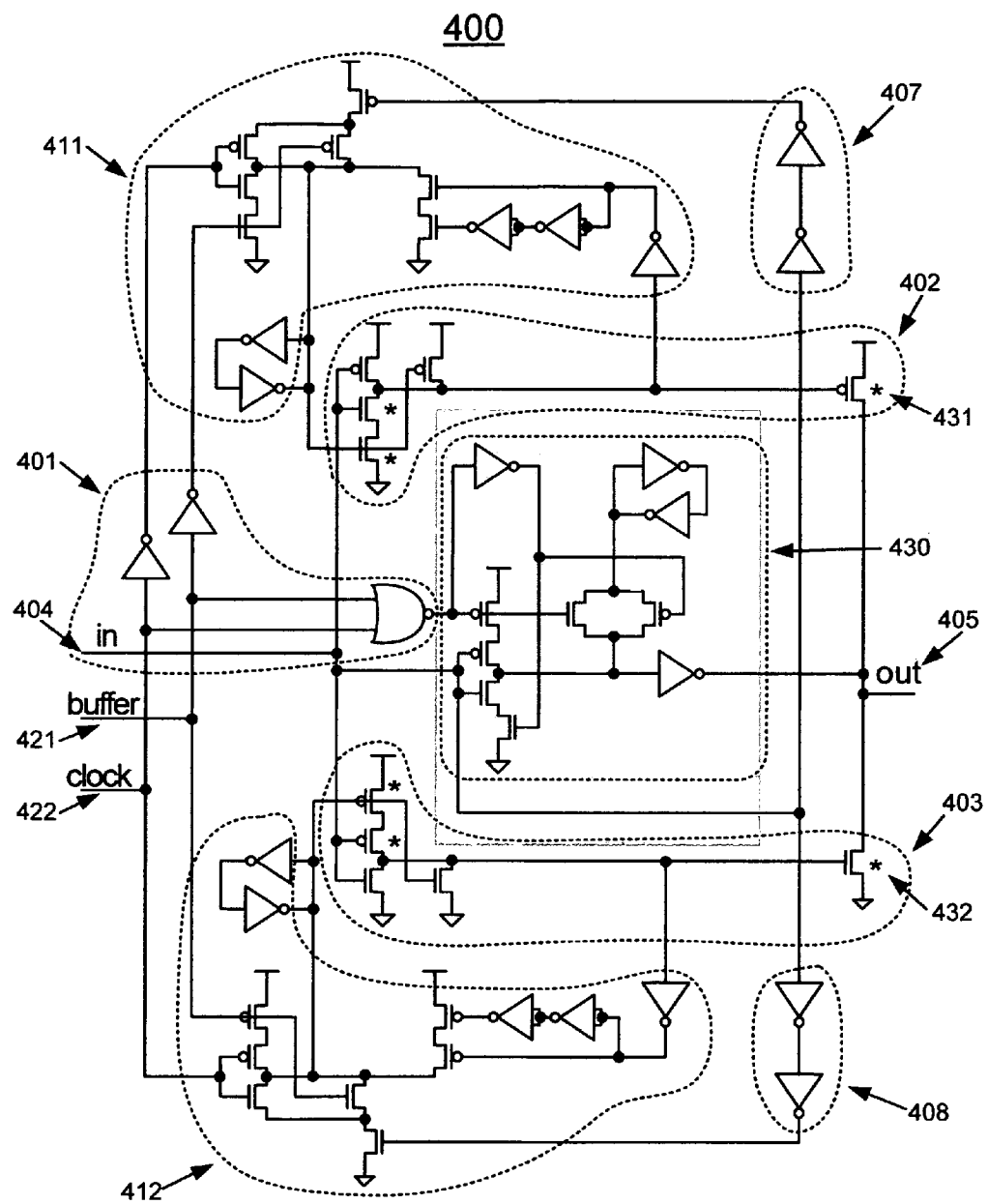
FIG. 4 shows a diagram of the basic components of an elastic pipeline latch in accordance with one embodiment the present invention.

FIG. 4 shows a diagram of the basic components of an elastic pipeline latch 400 in accordance with one embodiment the present invention. The elastic pipeline latch 400 can be used to implement the programmable latch/repeaters of a configurable signal path as described above, for example, in the description of FIG. 2.

As depicted in FIG. 4, the elastic pipeline latch 400, hereafter simply latch 400, includes a plurality of components. In FIG. 4 embodiment, the latch 400 includes a control input comprising control logic 401 for processing a control input signal (e.g., the buffer signal 421) for configuring the latch 400 into a repeater state or a latch state, a pair of drive components 402 and 403 responsive to the control logic 401 and for driving an input signal 404 through as an output signal 405, and a pair of pulse width/inhibit components 411 and 412 coupled to the drive components 402 and 403.

The latch further includes reset threshold components 407 and 408 coupled to the drive components 402 and 403 for inhibiting oscillation of the drive components 402–403, and a latch component 430 for passing the present state of the input 404 to the output signal 405 when configured in the repeater state and for maintaining the previous state of the output signal 405 when configured in the latch state and clock signal 422 is low.

Referring still to latch 400 FIG. 4, drive components 402–403 each comprise a plurality of transistors having a larger size than the other transistors comprising the other components of the latch 400. For example, as depicted in FIG. 4, these larger transistors are noted by the asterisk "*". These transistors are larger in order to provide sufficient drive to push the output signal 405 down a long signal path (e.g., a long signal path across an integrated circuit die).

In the latch 400 embodiment, transistor 431 of the drive component 402 is a large PFET transistor. This transistor is of sufficient size to drive an output high (e.g., logical one) through the output 405. Accordingly, the other transistors of drive component 402 are configured to turn on transistor 431 as rapidly as practicable in order to provide a fast rising edge to the output signal 405. Transistor 432 of the drive component 403 is a large NFET transistor. The other transistors of the drive component 403 are configured to keep the transistor 432 turned off as the transistor 431 is rapidly switched on. This configuration is intended to prevent a crowbar current flowing from the transistor 431 through the transistor 432, as the transistor 431 switches on.

The pulse width/inhibit components 411 and 412 are coupled to the drive components 402 and 403 and manage the firing of the large output transistors of the drive components. The pulse width/inhibit components 411 and 412 accomplish this by keeping the transistor 431 off while turning on the transistor 432 for the desired time, and vice versa. Additionally, the pulse width/inhibit components 411 and 412 are configured to reset the drive components 402 and 403 and make them ready to fire the next pulse (e.g., received from the input 404).

The pulse width/inhibit components 411 and 412 can be synchronously inhibited by the control logic 401. For example, in the latch state, the pulse width/inhibit components 411 and 412 inhibit the firing of the output components 402 and 403 when the clock signal 422 is low (e.g., they block the output 405). In the repeater state, the pulse width/inhibit components 411 and 412 permit the firing of the output components 402 and 403, regardless of the clock signal 422.

The reset threshold components 407 and 408 are coupled to the pulse width/inhibit components 411 and 412 and are configured to inhibit oscillation of the drive components 402–403. The reset threshold components 407 and 408 control the reset of the drive components 402–403. The reset threshold components 407 and 408 are configured to set a reset threshold and an operating threshold such that the reset threshold and the operating threshold are far enough apart in order to guarantee that there will be no oscillation over the range of voltage seen by the latch 400.at the input 404. Oscillation can be especially problematic in repeater applications where the voltage at the input 404 can rise and fall very slowly over time due to its propagation across a long transmission line (e.g., across an integrated circuit die). The reset threshold components 407 and 408 prevent oscillation due to slow rise and fall times of the input signal 404.

The drive components 402 and 403 drive the input signal 404 through to the output signal 405 with a very small delay. In the latch 400 embodiment, this delay is no more than two stages. For example, in either the repeater mode or the buffer mode, no more than two inverter stages are on the signal path between the input 404 and the output 405.

This small amount of delay makes the latch 400 particularly well-suited for demanding high-performance applications. For example, since latch 400 has only 60% to 70% the delay of a typical prior art repeater (e.g., double inverter relay), the latch 400 can satisfactorily perform at much higher frequencies (e.g., 1.4× to 1.5×) then prior art repeaters.

The latch component 430 functions by passing the present state of the input 404 to the output signal 405 when configured in the repeater state and for maintaining the previous state of the output signal 405 when configured in the latch state and clock signal 422 is low. The latch component 430 performs this function without adding delay to the signal path between the input 404 and the output 405. In this manner, the latch component 430 is off of the critical path between the input 404 and the output 405.

The latch component 430 functions as a keeper and a static latch. In the repeater state, the latch component 430 functions as a keeper by passing the present state of the input 404 to the output signal 405. In the latch state, the latch component 430 functions as a latch by maintaining the state of the output signal 405 when the clock input 422 is low.

Figure 5:
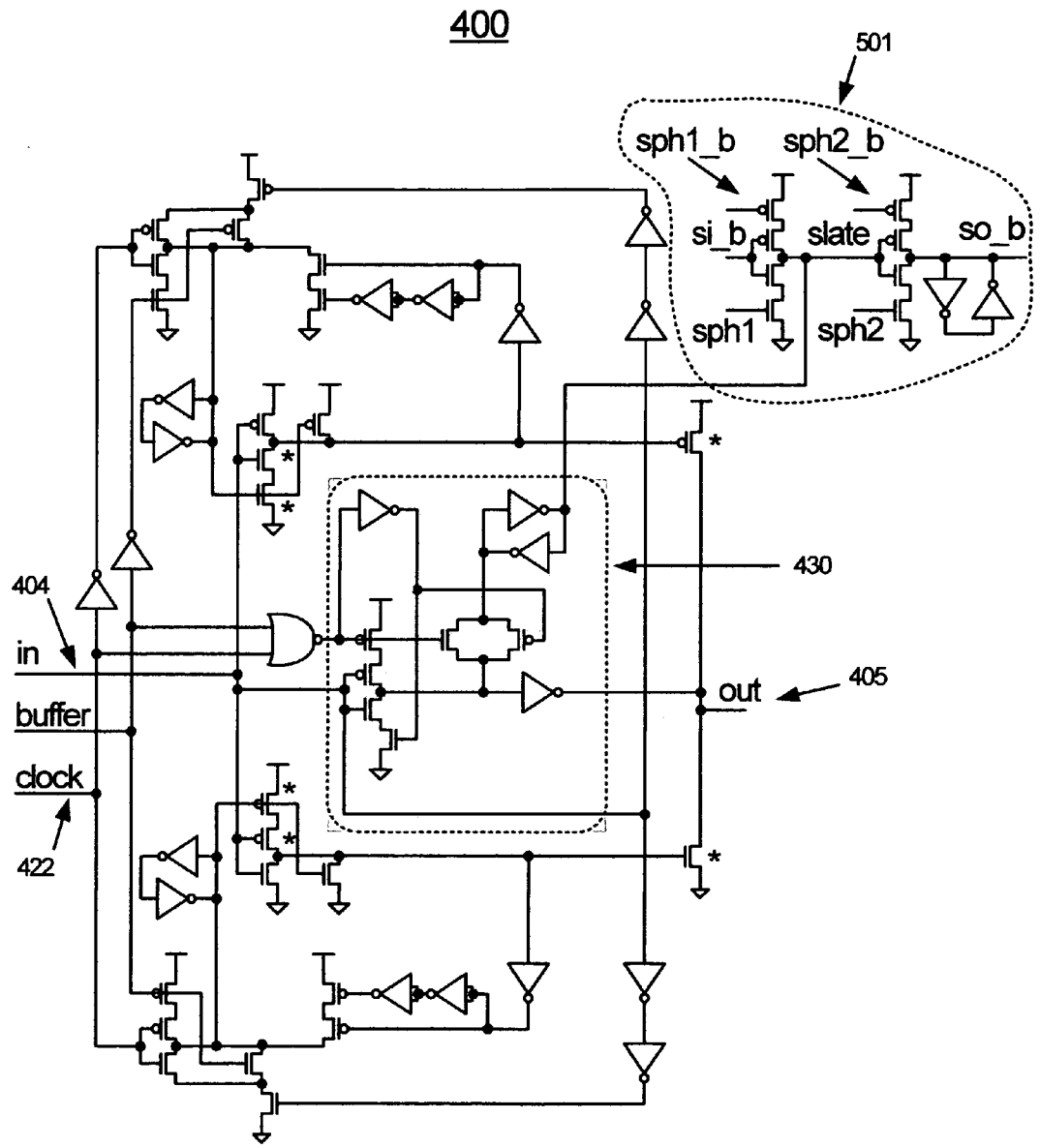
FIG. 5 shows a diagram of a latch including a scan component to provide scan-in and scan-out functionality in accordance with one embodiment of the present invention.

FIG. 5 shows a diagram of the latch 400 including a scan component 501 to provide scan-in and scan-out functionality in accordance with one embodiment of the present invention. The various signals of the scan component 501 are as shown (e.g., JTAG signals such as sph1_b, sph2_b, si_b, state, sph1, so_b, and sph2).

The FIG. 5 embodiment of the latch 400 supports full scan capability. The full scan capability is provided by means of the ability of the latch component 430 to be isolated. As depicted in FIG. 5, the latch component 430 comprises a transmission gate and a state element. When the latch 400 is in the repeater state, the clock signal 422 deactivates the transmission gate and connects the latch component 430 to input 404 so as to pass the present value of the input 404 to the output 405.

To scan the latch 400 in repeater operation (e.g., latch mode), the transmission gate is turned off by the clock signal 422 and the latch 400 becomes the master latch of a scan master slave flip-flop (MSFF).

During repeater operation (e.g., repeater mode), the latch component 430 is isolated from the signal data path between the input 404 and the output 405 by turning off the transmission gate. This allows the scan chain (e.g., scan component 501) to operate unimpeded by the latch 400 while in repeater mode.

Figure 6:
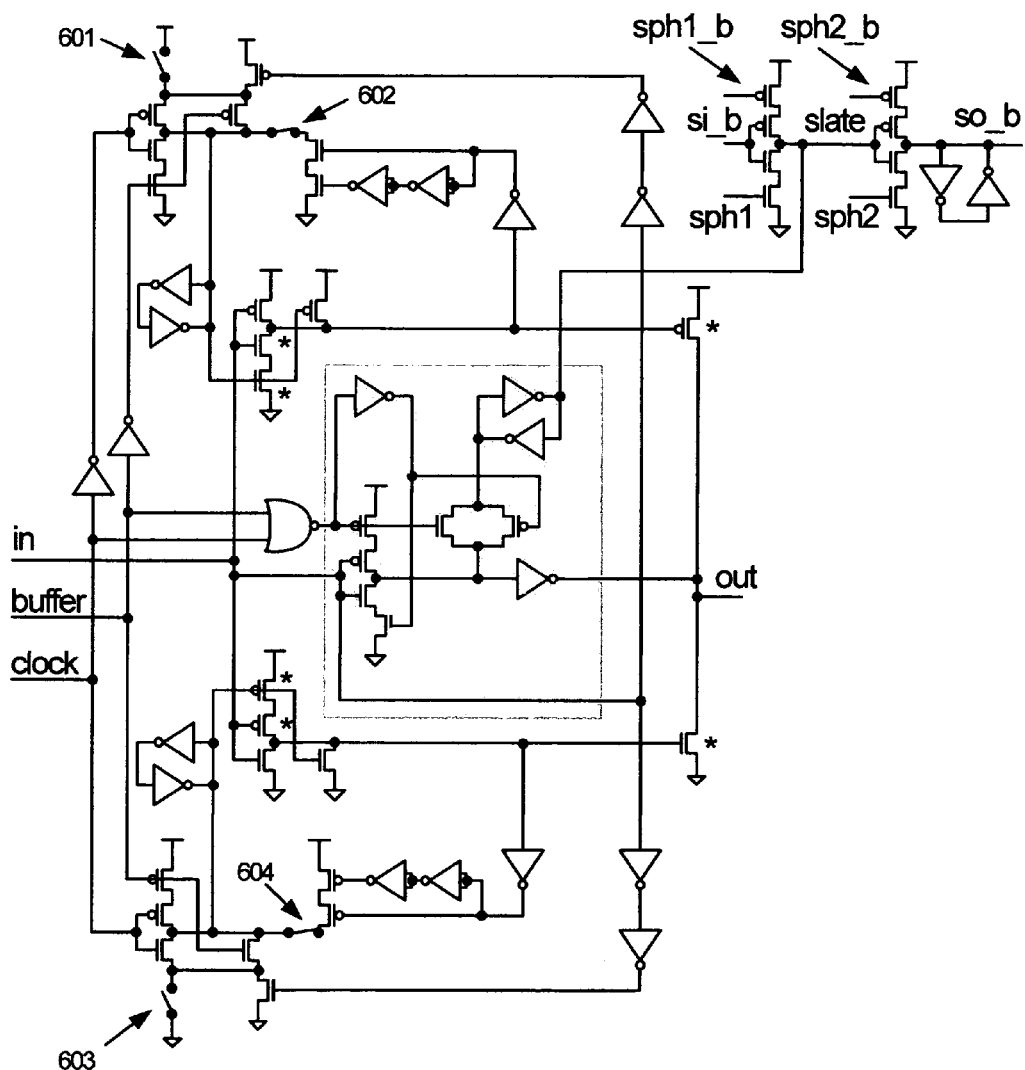
FIG. 6 shows a diagram of the latch including a plurality of safe mode switches in accordance with one embodiment of the present invention.

FIG. 6 shows a diagram of the latch 400 including a plurality of safe mode switches in accordance with one embodiment of the present invention. As depicted in FIG. 6, the latch 400 includes four switches 601–604. The switches 601–604 are configured to provide flexibility to the latch 400 with regard to the degree of functionality the latch 400 provides to the overall integrated circuit. Depending upon the manner in which the switches 601–604 are set, the latch circuit 400 can revert to a simpler state of operation, which in some circumstances may provide for more reliable operation, or a greater degree of troubleshooting capability to diagnose problems, for the overall integrated circuit device. As depicted in FIG. 6, the switches 601–604 are set to provide full functionality of the latch 400.

In one embodiment, the switches 601–604 are implemented as mask changeable elements adapted to be changed by metal mask alteration (e.g., engineering change orders) during device fabrication. Such changes can be implemented to debug problems with the overall integrated circuit or to manage risk of the overall project.

Figure 7:
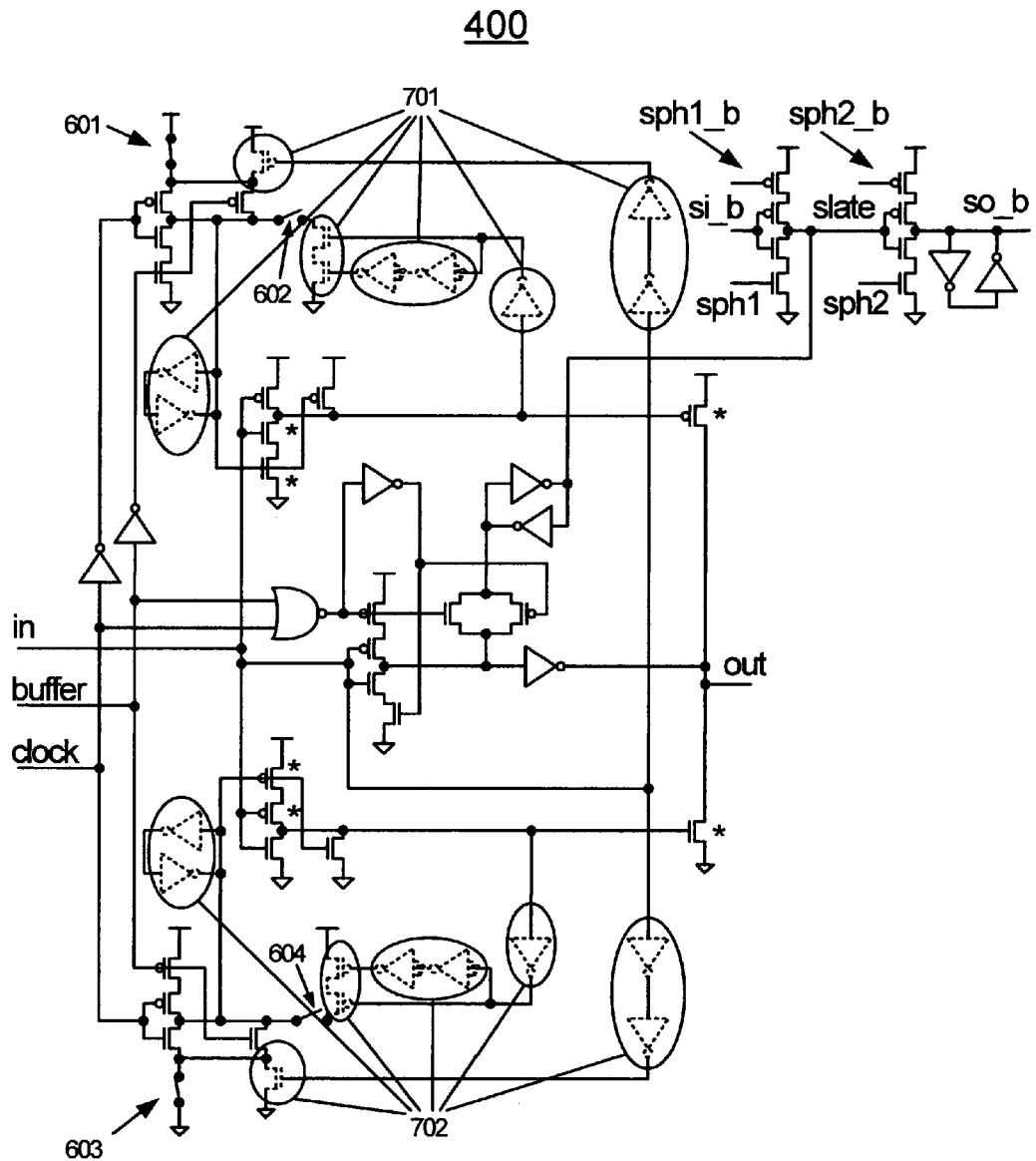
FIG. 7 shows a diagram of the latch in accordance with one embodiment of the present invention where the safe mode switches are set to safe mode as opposed to full functionality.

FIG. 7 shows a diagram of the latch 400 in accordance with one embodiment of the present invention where the safe mode switches 601–604 are set to safe mode as opposed to full functionality. As depicted in FIG. 7, the circles 701–702 shows the components which are inactivated during safe mode.

Figure 8:
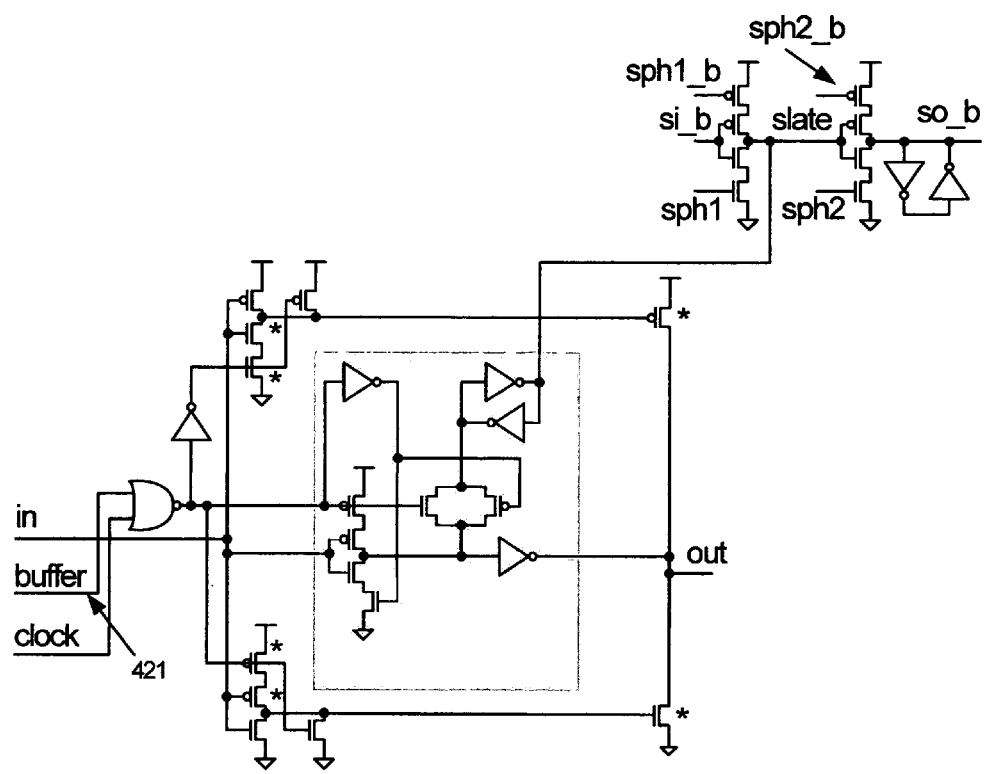
FIG. 8 shows a diagram of the latch in accordance with one embodiment of the present invention where the components that are inactivated during safe mode are not illustrated.

FIG. 8 shows a diagram of the latch 400 in accordance with one embodiment of the present invention where the components that are inactivated during safe mode are not illustrated. Additionally, as illustrated in FIG. 8, redundant logic gates of the latch 400 are combined according to ordinary logic equivalent operations. Thus, the schematic depiction of FIG. 8 is equivalent to the schematic depiction of FIG. 7.

It should be noted that, as shown in FIG. 8, when in safe mode, the latch 400 functions purely as a static tri-state-able "repeater-with-latch". When in buffer mode, the latch 400 resembles a conventional static double inverter buffer. When in latch mode, the large output transistors (e.g., as denoted by the asterisks) are tri-stated by the buffer input signal 421, and the latch 400 maintains state.

Figure 9:
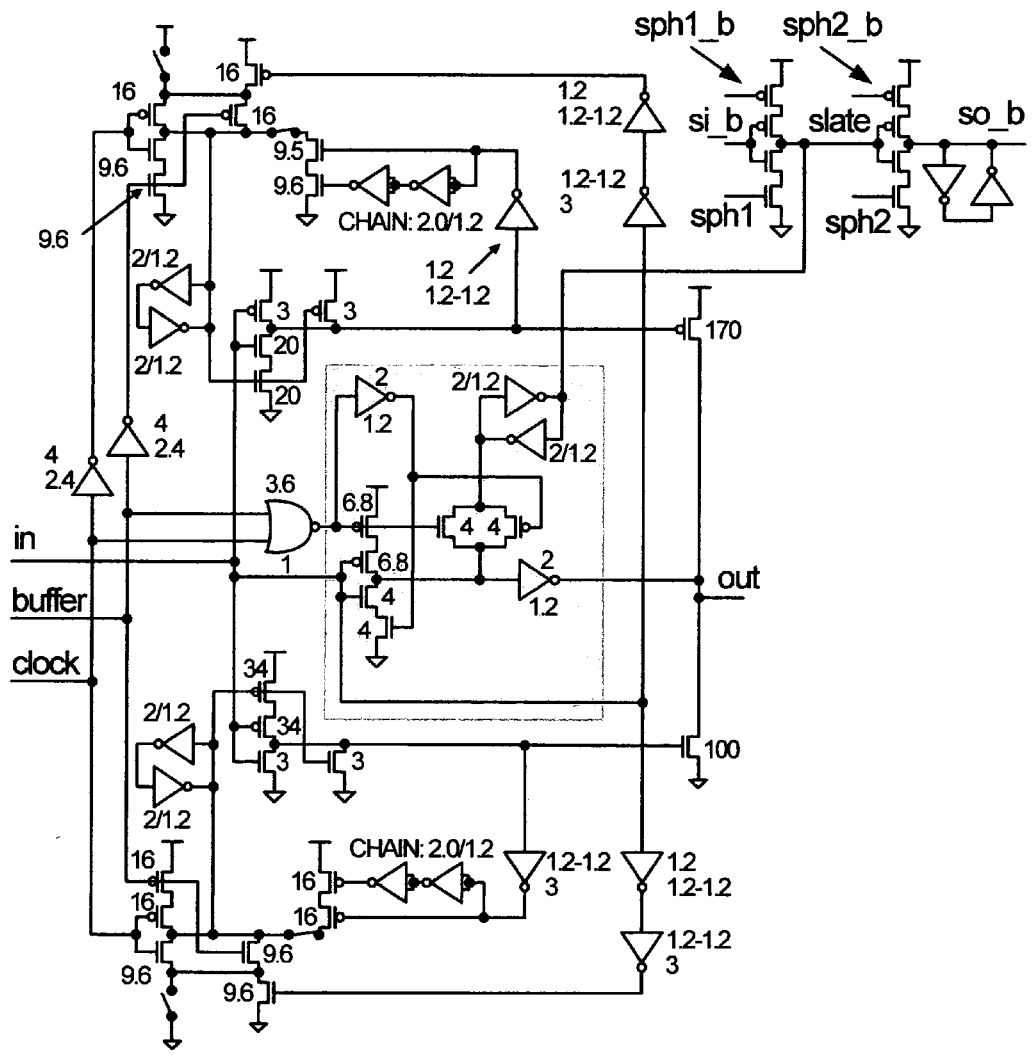
FIG. 9 shows a diagram of the latch in accordance with one embodiment of present invention whereby the device size ratios are numerically depicted by each of the transistors and the gates comprising the latch.

FIG. 9 shows a diagram of the latch 400 in accordance with one embodiment of present invention where by the device size ratios are numerically depicted by each of the transistors and the gates comprising the latch 400. As will be appreciated by those skilled in the art, the numbers depicted adjacent to the transistors and the gates comprising the latch 400 are ratios of device sizes. These ratios between the devices are portable across different fabrication technologies. The absolute sizes of the devices need to be selected as dictated by the specific fabrication technology used to build the latch 400.

Figure 10:
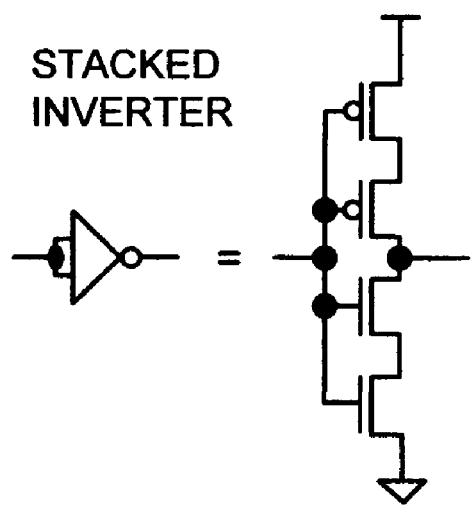
FIG. 10 shows a diagram of a stacked inverter in accordance with one embodiment of present invention.

FIG. 10 shows a diagram of a stacked inverter in accordance with one embodiment of present invention. As shown in FIG. 10, the stacked inverter (e.g., on the right side of FIG. 10) is shown alongside its equivalent schematic representation as shown in the above figures.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A latch for an elastic pipeline, comprising:
   a control input for configuring the latch into a repeater state or a latch state;
   a drive component responsive to the control input and for driving an input signal through as an output signal;
   a pulse width/inhibit component coupled to the drive component;
   a reset threshold component coupled to the drive component for inhibiting oscillation of the drive component; and
   a latch component for passing a present state of the input signal to the output signal when configured as the repeater state and for maintaining a previous state of the output signal during transitions of a clock signal when configured as the latch state.

2. The latch of claim 1, further comprising:
   a scan component coupled to the latch component and configured for scanning out a latch state to an external circuit in an input mode and for scanning out the latch state from the external circuit in an output mode.

3. The latch of claim 1, further comprising:
   a plurality of safe mode switches coupled to the reset threshold component and the pulse width/inhibit component and configured to inactivate the reset threshold component and the pulse width/inhibit component when a safe mode is activated.

4. The latch of claim 3, wherein the safe mode switches comprise mask changeable elements configured for change by metal mask alteration during fabrication.

5. The latch of claim 1, wherein the drive component comprises a plurality of transistors having a size larger than a plurality of transistors comprising the pulse width/inhibit component and the reset threshold component.

6. The latch of claim 1, wherein a signal path between an input signal in the output signal propagates through no more than two inverter stages in either the repeater state or the latch state.

7. A latch circuit for receiving a data input signal and for providing an output signal, the latch circuit comprising:
   a buffer input for configuring the latch into a repeater state or a latch state;
   a plurality of drive transistors responsive to the buffer input and for driving the input signal through as the output signal;
   a pulse width/inhibit circuit coupled to the drive transistors;
   a reset threshold circuit coupled to the drive transistors for inhibiting oscillation of the drive transistors; and
   a latch circuit for passing a present state of the input signal to the output signal when configured as the repeater state and for maintaining a previous state of the output signal during transitions of a clock signal when configured as the latch state.

8. The latch circuit of claim 7, further comprising:
   a scan circuit coupled to the latch circuit and configured for scanning out a latch state to an external circuit in an input mode and for scanning out the latch state from the external circuit in an output mode.

9. The latch circuit of claim 7, further comprising:
   a plurality of safe mode switches coupled to the reset threshold circuit and the pulse width/inhibit circuit and configured to inactivate the reset threshold circuit and the pulse width/inhibit circuit when a safe mode is activated.

10. The latch of circuit claim 9, wherein the safe mode switches comprise mask changeable elements configured for change by metal mask alteration during fabrication.

11. The latch of circuit claim 7, wherein the drive transistors comprises a plurality of transistors having a size larger than a plurality of transistors comprising the pulse width/inhibit circuit and the reset threshold circuit.

12. The latch of circuit claim 7, wherein a signal path between an input signal in the output signal propagates through no more than two inverter stages in either the repeater state or the latch state.

13. A digital integrated circuit having a configuring a signal path, comprising:

a first logic module configured to transmit an output;

a second logic module configured to receive the output;

a configurable signal path for conveying the output from the first logic module to the second logic module, wherein the configurable signal path is variable by selectively including at least one latch, comprising:

a control input for configuring the latch into a repeater state or a latch state;

a drive component responsive to the control input and for driving an input signal through as an output signal;

a pulse width/inhibit component coupled to the drive component;

a reset threshold component coupled to the drive component for inhibiting oscillation of the drive component; and a latch component for passing a present state of the input signal to the output signal when configured as the repeater state and for maintaining a previous state of the output signal during transitions of a clock signal when configured as the latch state.

14. The digital integrated circuit of claim 13, further comprising:

a scan component coupled to the latch component and configured for scanning out a latch state to an external circuit in an input mode and for scanning out the latch state from the external circuit in an output mode.

15. The digital integrated circuit of claim 13, further comprising:

a plurality of safe mode switches coupled to the reset threshold component and the pulse width/inhibit component and configured to inactivate the reset threshold component and the pulse width/inhibit component when a safe mode is activated.

16. The digital integrated circuit of claim 15, wherein the safe mode switches comprise mask changeable elements configured for change by metal mask alteration during fabrication.

17. The digital integrated circuit of claim 13, wherein the drive component comprises a plurality of transistors having a size larger than a plurality of transistors comprising the pulse width/inhibit component and the reset threshold component.

18. The digital integrated circuit of claim 13, wherein a signal path between an input signal in the output signal propagates through no more than two inverter stages in either the repeater state or the latch state.

* * * * *